(12) United States Patent
Nistler et al.

(10) Patent No.: US 6,798,203 B2
(45) Date of Patent: Sep. 28, 2004

(54) RF ANTENNA FOR AN OPEN MR SYSTEM

(75) Inventors: Jürgen Nistler, Erlangen (DE);
Wolfgang Renz, Erlangen (DE);
Markus Vester, Nürnberg (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/102,187

(22) Filed: Mar. 20, 2002

(65) Prior Publication Data

US 2002/0145428 A1 Oct. 10, 2002

(30) Foreign Application Priority Data

Apr. 4, 2001 (DE) .......................................... 101 16 802

(51) Int. Cl.⁷ ................................................. G01V 3/00
(52) U.S. Cl. ..................................................... 324/318
(58) Field of Search ................................. 324/300, 307, 324/309, 318, 322, 313; 600/410, 422; 335/296, 299, 302, 306; 333/219, 221, 222–223, 227, 230, 231

(56) References Cited

U.S. PATENT DOCUMENTS

| | | | | |
|---|---|---|---|---|
| 4,943,774 A | * | 7/1990 | Breneman et al. ........... | 324/318 |
| 5,153,517 A | * | 10/1992 | Oppelt et al. ............... | 324/322 |
| 5,347,252 A | * | 9/1994 | Ries ........................... | 335/299 |
| 5,467,017 A | | 11/1995 | Duerr et al. | |
| 5,530,351 A | | 6/1996 | Moritz et al. | |
| 5,548,218 A | * | 8/1996 | Lu .............................. | 324/318 |
| 5,663,645 A | * | 9/1997 | Kaufman et al. ........... | 324/318 |
| 5,696,449 A | * | 12/1997 | Boskamp .................... | 324/318 |
| 5,731,704 A | * | 3/1998 | Schnur et al. .............. | 324/320 |
| 5,757,189 A | * | 5/1998 | Molyneaux et al. ........ | 324/318 |
| 5,808,467 A | * | 9/1998 | Ochi et al. .................. | 324/309 |
| 6,011,393 A | * | 1/2000 | Kaufman et al. ........... | 324/318 |
| 6,097,187 A | * | 8/2000 | Srivastava et al. .......... | 324/320 |
| 6,144,205 A | * | 11/2000 | Souza et al. ................ | 324/322 |
| 6,208,144 B1 | * | 3/2001 | McGinley et al. .......... | 324/319 |
| 6,249,121 B1 | * | 6/2001 | Boskamp et al. ........... | 324/318 |
| 6,320,383 B1 | * | 11/2001 | Kato et al. .................. | 324/318 |
| 6,326,789 B1 | * | 12/2001 | Yoshida et al. ............. | 324/318 |
| 2002/0105328 A1 | * | 8/2002 | Goto et al. .................. | 324/307 |

FOREIGN PATENT DOCUMENTS

EP 0 314 262 5/1989

* cited by examiner

Primary Examiner—Christopher W. Fulton
Assistant Examiner—Dixomara Vargas
(74) Attorney, Agent, or Firm—Schiff Hardin LLP

(57) ABSTRACT

An RF transmission/reception antenna for an open MR system, wherein the bottom and top poles of the basic field magnet are connected to one another by two columns, is composed of an electrically conductive connecting loop that surrounds the patient space and is formed by the basic field magnetic system with the connecting columns, with a shortening capacitor inserted in the loop.

6 Claims, 2 Drawing Sheets

RF ANTENNA FOR AN OPEN MR SYSTEM

BACKGROUND OF THE INVENTION

1. Field of the Invention

The invention is directed to an RF transmission/reception antenna for an open MR system, of the type wherein the bottom and top poles of the basic field magnet are connected to one another by two columns.

2. Description of the Prior Art

Conventionally, antennas in stripline form have been employed as RF transmission/reception antenna. The antenna is composed of striplines that are shorted at the end with one or more resonant capacitors relative to a ground or shield plane and thus are balanced to resonance. A significant disadvantage of this antenna structure is the poor efficiency due to the slight distance between the actual conductors and the shield surface. Increasing the distances is in fact conceivable but the space for the patient is then also reduced as a result.

SUMMARY OF THE INVENTION

An object of the present invention is to provide an RF transmission/reception antenna for an open RF system that, with a simple structure and while maintaining the largest possible acceptance space for the patient, has a higher efficiency than known stripline antennas.

This object is inventively achieved in an RF antenna having an electrically conductive connecting loop that surrounds the patient space and that is formed by the basic field magnetic system with the connecting columns, and having a shortening capacitor inserted in the loop.

The basis of the present invention is that the basic field magnet itself is integrated into the antenna and its metallic surface is utilized as an active conductor. The insertion of shortening capacitors is required for utilization of this conductor loop and MR antenna. The interruption of this loop for the direct insertion of such resonant capacitors is a solution that, however, is frequently not expedient in practice. For example, the electrically conductive connecting loop can be separated at a location, particularly in the region of a column, for the insertion of the shortening capacitor.

A solution has proven more expedient to attach a resonant cavity, having a capacitor, to at least one of the connecting columns, so that a capacitance is transformed into the loop, the tuning to resonance and an adaptation to the MR transmitter is possible as a result. The efficiency of the inventive resonator antenna is significantly higher than that of the conventional solution with striplines. Another advantage is the elimination of the vertical space that was required for the conventional body resonator.

The feed can ensue directly at the resonant cavities at the columns in the immediate proximity of the space provided for the matching units. Given a tilted magnet (such as, for example, the type referred to as a "double donut"), this inventive principle of the structure of the RF antenna having a loop surrounding the patient acceptance space can, of course, be likewise applied. The structure can be designed such that the upper brace contains a capacitive impedance that can be realized by a blocking or rejection circuit. In this case, a division of the vacuum vessel would also be possible at the top, so that a doubled top would no longer be required at all, which would then yield a significant gain in bandwidth and efficiency.

A slight disadvantage of the inventive structure of the RF antenna is the large excitation volume of the antenna, which is prescribed by the shape of the magnet housing. In order to reduce ambiguity artifacts in the MR images, in a further embodiment of the invention auxiliary resonators generating an opposing field are laterally arranged at the gradient coil for the spatial limitation of the RF field in the region of the patient axis. These auxiliary resonators, which can be constructed as striplines shorted at both ends and that can be excited with the main resonator due to the inductive coupling, generate a B-field that is directed opposite to the main field and compensates the field in the outside space. As a result, a rapid field drop occurs in the patient direction and the ambiguity artifact is reduced.

DESCRIPTION OF THE PREFERRED EMBODIMENTS

Figure 1:
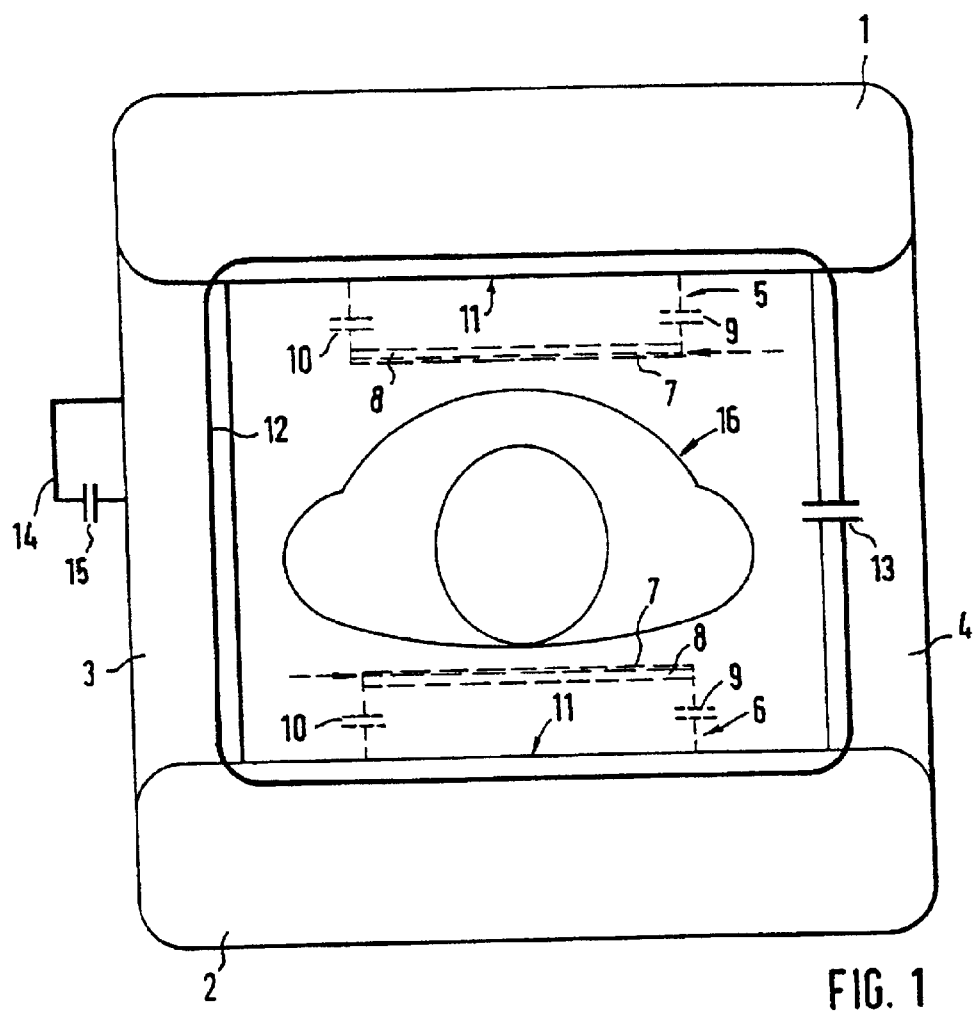
FIG. 1 is a schematic view of an open MR system wherein the inventive RF antenna, utilizing the metallic surface of the magnet system, forms a loop around the patient, with two conventional stripline antennas have been entered in broken lines.

FIG. 1 shows an end view in the direction of the patient insertion axis of an open MR system, having an upper basic field magnet pole 1 and a lower basic field magnet pole 2 that are connected to one another by connecting columns 3 and 4.

Instead of the standard RF antennas 5 and 6 (indicated with broken lines) in stripline form, whereby striplines 7 that are arranged on a carrier plate 8 are balanced for resonance via resonant capacitors 9 and 10 to a ground or shield plane 11, the magnet itself is inventively integrated into the antenna by the metallic surface of the magnetic system itself being used as an active conductor. In the illustrated open system having the two connecting columns 3 and 4 for connecting the bottom pole 2 to the top pole 1, an antenna is then obtained that forms a loop 12 around the patient. For utilizing this conductor loop as an MR antenna, the insertion of shortening capacitors 13 is required. This can be done by interrupting the electrical connections of one of the columns and directly inserting one such shortening capacitor 13 in this gap. Preferably, however, as shown in FIG. 1, a resonant cavity 14 is attached to the column 3, which transforms a capacitance 15 to be effective as a shortening capacitor 13 in the loop 12. Tuning to resonance and an adaptation to the MR transmitter thus are possible as a result. With the elimination of stripline antennas 5 and 6, a significantly larger space for the patient 16 derives as a result of the inventive fashioning of the antenna.

Figure 2:
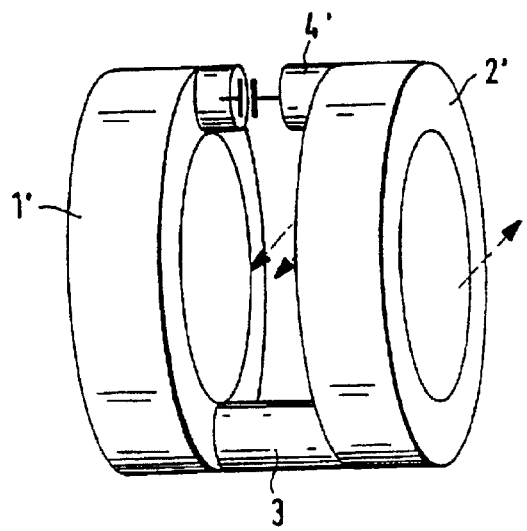
FIG. 2 is a schematic, perspective view of a MR system given a "double donut" with the inventive antenna.

FIG. 2 schematically shows the employment of the antenna in a "double donut" configuration. The upper connector 4' contains a capacitive impedance that can be realized as a blocking or rejecter circuit. As warranted, a division of the vacuum vessel would also be possible at the top in this case, so that a doubled top is not necessary at all (as would be conventional for such a configuration). A significant gain in bandwidth and efficiency are achieved as a result.

Figure 3:
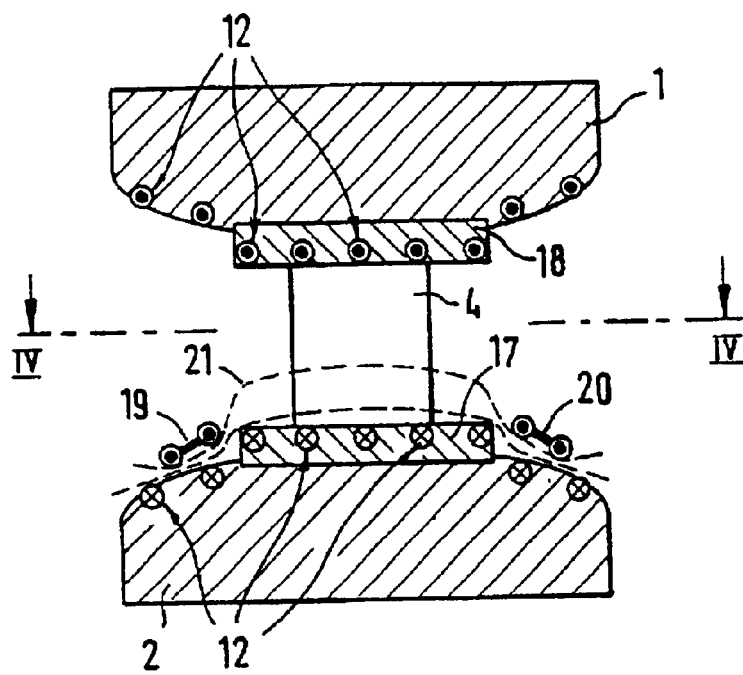
FIG. 3 is a section through a modified open MR system in the middle plane between the connecting columns, wherein auxiliary resonators for avoiding ambiguity artifacts are provided in addition to the antenna loop in accordance with the invention.
Figure 4:
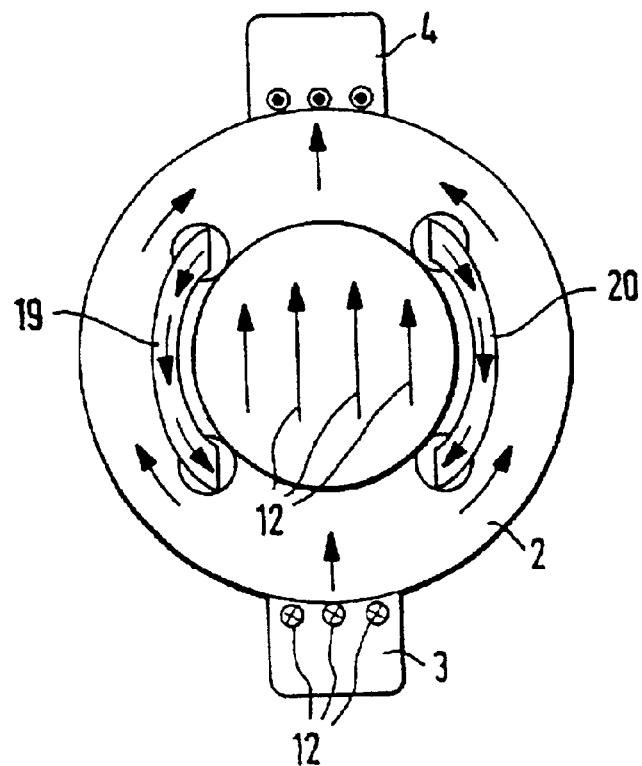
FIG. 4 is a section along the line IV—IV in FIG. 3.

In the modified exemplary embodiment of the invention shown in FIGS. 3 and 4, which is essentially constructed like the arrangement of FIG. 1, the high-frequency currents of the principal resonance, i.e. of the loop 12 in FIG. 1, are indicated and the gradient coils 17 and 18 also are schematically indicated in FIGS. 3 and 4. The important difference of the arrangement according to FIGS. 3 and 4 compared to that of FIG. 1 is the arrangement of additional auxiliary resonators 19 and 20 laterally next to the gradient coils 17 and 18. These auxiliary resonators 19 and 20 serve the purpose of spatially limiting the radio-frequency field in the direction of the longitudinal patient axis. In the illustrated exemplary embodiment, they are fashioned as inductively coupled stripline resonators that generate an opposing field relative to the principal RF field in the outside region. As a result, a sharp (rapid) field drop ensues in the patient direction (see the dashed-line field line 21 in FIG. 3) and ambiguity artifacts are thereby reduced.

Although modifications and changes may be suggested by those skilled in the art, it is in the intention of the inventors to embody within the patent warranted hereon all changes and modifications as reasonably and properly come within the scope of their contribution to the art.

We claim as our invention:

1. In an open magnetic resonance imaging system having a basic field magnet with a top pole and a bottom pole spaced from each other and connected to each other by two columns, and having an examination volume therebetween, the improvement of a radio frequency transmission/reception antenna comprising:

said basic field magnet system and said connecting columns having electrically conductive components that are integral parts of said basic field magnet system and said connecting columns; and an electrically conductive looped path surrounding said examination volume and formed by said conductive components of said basic field magnet system and said connecting columns, with a shortening capacitor connected in said looped path.

2. The open magnetic resonance imaging system of claim 1 wherein said electrically conductive connecting looped path is interrupted at a location at which said shortening capacitor is inserted.

3. The open magnetic resonance imaging system of claim 2 wherein said location is in one of said connecting columns.

4. The open magnetic resonance imaging system of claim 1 further comprising a resonant cavity containing a resonant cavity capacitor, and wherein said resonant cavity capacitor is transformed into said looped path as said shortening capacitor.

5. The open magnetic resonance imaging system of claim 1 wherein said open magnetic resonance system has gradient coils which generate gradient fields in said examination volume, and wherein said improvement further comprises auxiliary resonators, disposed laterally relative to said gradient coils, for generating an auxiliary field in a direction opposite to a basic magnetic field generated by said basic field magnet, thereby spatially limiting a radio frequency field generated by said radio frequency transmission/reception antenna in a direction along a patient-insertion axis proceeding through said examination volume.

6. The open magnetic resonance imaging system of claim 5 wherein said auxiliary resonators comprise striplines shortened at each end, and excited by inductive coupling with said radio-frequency transmission/reception antenna.

* * * * *